US010002913B2

(12) United States Patent
Choe

(10) Patent No.: US 10,002,913 B2
(45) Date of Patent: Jun. 19, 2018

(54) METHOD OF MANUFACTURING ORGANIC LIGHT-EMITTING DISPLAY APPARATUS

(71) Applicant: Samsung Display Co., Ltd., Yongin-si (KR)

(72) Inventor: Wonkyu Choe, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days. days.

(21) Appl. No.: 15/244,732

(22) Filed: Aug. 23, 2016

(65) Prior Publication Data

US 2017/0194396 A1 Jul. 6, 2017

(30) Foreign Application Priority Data

Jan. 5, 2016 (KR) .................. 10-2016-0001069

(51) Int. Cl.
*H01L 21/00* (2006.01)
*H01L 27/32* (2006.01)
*H01L 51/50* (2006.01)
*H01L 51/52* (2006.01)
*H01L 51/00* (2006.01)
*H01L 51/56* (2006.01)

(52) U.S. Cl.
CPC ...... *H01L 27/3246* (2013.01); *H01L 27/3211* (2013.01); *H01L 51/5056* (2013.01); *H01L 51/5072* (2013.01); *H01L 51/5088* (2013.01); *H01L 51/5092* (2013.01); *H01L 51/5284* (2013.01); *H01L 51/0018* (2013.01); *H01L 51/56* (2013.01)

(58) Field of Classification Search
CPC . H01L 51/56; H01L 51/0018; H01L 51/5012; H01L 2251/5323; H01L 2251/5338; H01L 27/326
See application file for complete search history.

(56) References Cited

U.S. PATENT DOCUMENTS

| 8,969,106 | B2 | 3/2015 | Lee et al. |
| 9,147,862 | B2 | 9/2015 | Kim et al. |
| 9,159,946 | B2 | 10/2015 | Choi et al. |
| 9,252,398 | B2 | 2/2016 | Heo et al. |

(Continued)

FOREIGN PATENT DOCUMENTS

| KR | 10-2005-0027464 | 3/2005 |
| KR | 10-2013-0018501 | 2/2013 |

(Continued)

*Primary Examiner* — John M Parker
(74) *Attorney, Agent, or Firm* — H.C. Park & Associates, PLC

(57) ABSTRACT

A method of manufacturing an organic light-emitting display apparatus including forming a first electrode on a substrate, forming a pixel defining layer on the substrate, forming a second electrode on the pixel defining layer and a portion of the first electrode, forming a sacrificial layer on the second electrode, patterning the sacrificial layer so as to expose a portion of the second electrode wherein the portion of the second electrode is disposed on the pixel defining layer, forming a conductive layer on the sacrificial layer and the portion of the second electrode, and removing the sacrificial layer such that a portion of the conductive layer on the portion of the second electrode remains.

14 Claims, 9 Drawing Sheets

(56) References Cited

U.S. PATENT DOCUMENTS

| | | | | |
|---|---|---|---|---|
| 2007/0222372 | A1* | 9/2007 | Cok | H01L 51/5268 313/504 |
| 2014/0055721 | A1* | 2/2014 | Choi | G02F 1/1333 349/96 |
| 2015/0140729 | A1* | 5/2015 | Ferro | G03F 7/2022 438/99 |
| 2015/0198829 | A1* | 7/2015 | Chae | G02F 1/133512 349/43 |

FOREIGN PATENT DOCUMENTS

| | | |
|---|---|---|
| KR | 10-2014-0045847 | 4/2014 |
| KR | 10-2014-0078357 | 6/2014 |
| KR | 10-2015-0031099 | 3/2015 |
| KR | 10-2015-0044083 | 4/2015 |

* cited by examiner

METHOD OF MANUFACTURING ORGANIC LIGHT-EMITTING DISPLAY APPARATUS

CROSS-REFERENCE TO RELATED APPLICATION

This application claims priority from and the benefit of Korean Patent Application No. 10-2016-0001069, filed on Jan. 5, 2016, which is hereby incorporated by reference for all purposes as if fully set forth herein.

BACKGROUND

Field

Exemplary embodiments relate to an organic light-emitting display apparatus and a method of manufacturing thereof.

Discussion of the Background

An organic light-emitting display apparatus is a display apparatus including organic light-emitting devices in a display area. An organic light-emitting device includes a first electrode, a second electrode, and an organic light-emitting layer disposed between the first electrode and the second electrode. The second electrode may be commonly provided among a plurality of pixels.

In a case of a large-sized organic light-emitting display apparatus, various attempts have been made to obtain an electrical conductivity of the electrode to prevent degradation in image quality. However, in a method of manufacturing an organic light-emitting display apparatus, light-emitting devices may be damaged during a process of patterning electrodes for obtaining the electrical conductivity.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of manufacturing an organic light-emitting display apparatus, capable of preventing damage to organic light-emitting devices during a process of patterning electrodes, and patterning electrodes with a high definition.

Additional aspects will be set forth in the detailed description which follows, and, in part, will be apparent from the disclosure, or may be learned by practice of the inventive concept.

An exemplary embodiment disclose a method of manufacturing an organic light-emitting display apparatus including: forming a first electrode on a substrate; forming a pixel defining layer on the substrate, the pixel defining layer exposing a portion of the first electrode; forming a second electrode on the pixel defining layer and the portion of the first electrode; forming a sacrificial layer on the second electrode; patterning the sacrificial layer so as to expose a portion of the second electrode, wherein the portion of the second electrode is disposed on the pixel defining layer; forming a conductive layer on the sacrificial layer and the portion of the second electrode; and removing the sacrificial layer such that a portion of the conductive layer on the portion of the second electrode remains.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
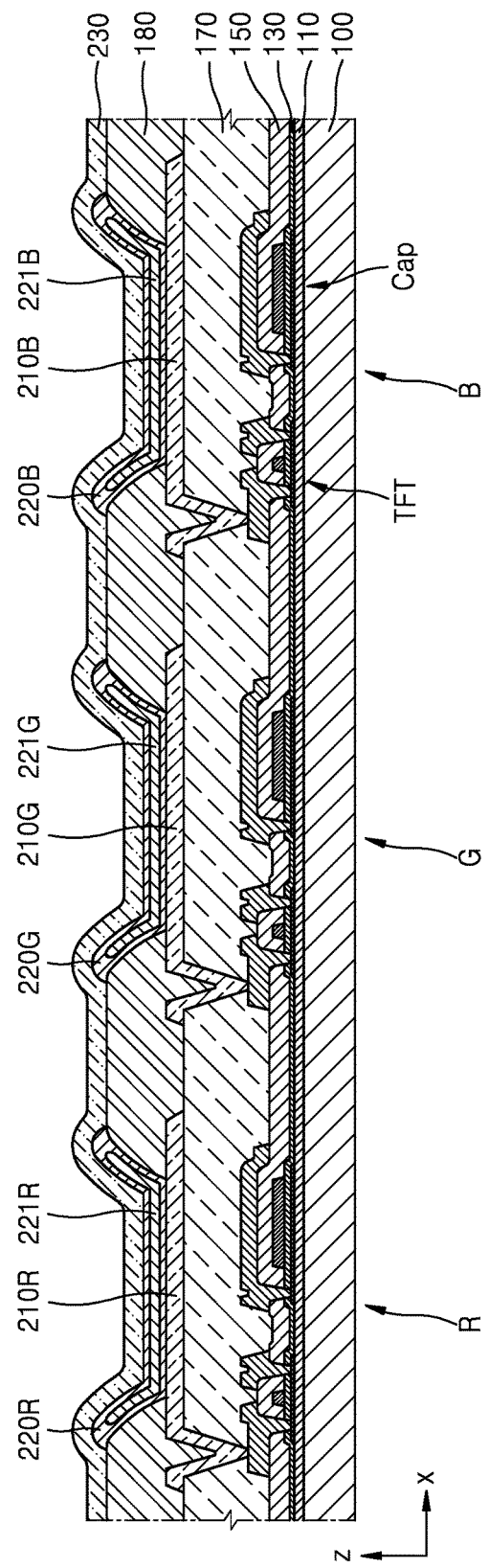
FIG. 1, FIG. 2, FIG. 3, FIG. 4, FIG. 5, FIG. 6, and FIG. 7 are cross-sectional views illustrating manufacturing processes of an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1, FIG. 2, FIG. 3, FIG. 4, FIG. 5, FIG. 6, and FIG. 7 are cross-sectional views illustrating manufacturing processes of an organic light-emitting display apparatus according to an exemplary embodiment.

Referring to FIG. 1, a backplane may be prepared. The backplane may include at least a substrate 100, first electrodes 210R, 210G, and 210B disposed on the substrate 100, a pixel defining layer 180 exposing portions of first electrodes 210R, 210G, and 210B, intermediate layers 220R, 220G, and 220B disposed on the exposed portions of first electrodes 210R, 210G, and 210B, and a second electrode 230 covering the intermediate layers 220R, 220G, and 220B and the pixel defining layer 180. In this case, the pixel defining layer 180 may have a shape that protrudes further (in a +z-axis direction) than the first electrodes 210R, 210G, and 210B.

The first electrodes 210R, 210G, and 210B may be formed on a planarization layer 170.

The first electrodes 210R, 210G, and 210B may be transparent electrodes, translucent electrodes, or reflective electrodes. The transparent electrodes and the translucent electrodes may include indium tin oxide (ITO), indium zinc oxide (IZO), zinc oxide (ZnO), indium oxide ($In_2O_3$), indium gallium oxide (IGO), or aluminum zinc oxide (AZO). The reflective electrodes may include a reflective layer including silver (Ag), magnesium (Mg), aluminum (Al), platinum (Pt), palladium (Pd), aurum (Au), nickel (Ni), neodymium (Nd), iridium (Ir), chromium (Cr), or a compound of these metals and a layer including ITO, IZO, ZnO, or $In_2O_3$. However, configurations and materials of the first electrodes 210R, 210G, and 210B are not limited thereto, and various modifications are possible.

The pixel defining layer 180 may be formed on the first electrodes 210R, 210G, and 210B and the planarization layer 170. A height from the planarization layer 170 to a top surface of the pixel defining layer 180 may be greater than a height from the planarization layer 170 to a top surface of the first electrodes 210R, 210G, and 210B.

The pixel defining layer 180 may define a pixel via openings corresponding to respective sub-pixels, that is, openings exposing portions of the first electrodes 210R, 210G, and 210B. In addition, the pixel defining layer 180 may separate the first electrodes 210R, 210G, and 210B from the second electrode 230, thereby preventing the occurrence of an arc forming between them. For example, an occurrence of an arc may be reduced when increasing a distance between ends of first electrodes 210R, 210G, and 210B and the second electrode 230. The pixel defining layer 180 may include inorganic materials, such as silicon nitride, silicon oxide or silicon oxynitride, or organic materials, such as acryl and polyimide.

The intermediate layers 220R, 220G, and 220B, including organic light-emitting layers 221R, 221G, and 221B, may be disposed on the first electrodes 210R, 210G, and 210B exposed by the pixel defining layer 180. The organic light-emitting layers 221R, 221G, and 221B may include lower molecular weight organic materials or polymer organic materials. The intermediate layers 220R, 220G, and 220B may further include functional layers, such as a hole transport layer (HTL), a hole injection layer (HIL), an electron transport layer (ETL), and an electron injection layer (EIL).

The organic light-emitting layer may include different materials from each other per respective sub-pixels. For example, as illustrated in FIG. 1, a red color light-emitting layer 221R, a green color light-emitting layer 221G, and a blue color light-emitting layer 221B may be respectively disposed in a red color sub-pixel (R), a green color sub-pixel (G), and a blue color sub-pixel (B).

A fine metal mask (FMM) (not shown) may be used when the red color light-emitting layer 221R, the green color light-emitting layer 221G, and the blue color light-emitting layer 221B are disposed. In this case, a space, etc. may be disposed on the pixel defining layer 180 so that the FMM may not contact pre-disposed portions of the pixel defining layer 180 or intermediate layers 220R, 220G, 220B.

A material to form the second electrode 230 may be doped, dotted, or deposited to cover intermediate layers 220R, 220G, and 220B, and the pixel defining layer 180.

The second electrode 230 may receive an electrical signal from an electrode power supply line. The second electrode 230 may contact the electrode power supply line outside of a display area. The second electrode 230 may include a transparent electrode, a translucent electrode, or a reflective electrode. In the case of the translucent electrode, the second electrode 230 may include a layer, which includes lithium (Li), calcium (Ca), lithium fluoride/calcium (LiF/Ca), lithium fluoride/aluminum (LiF/Al), aluminum (Al), magnesium (Mg), or a compound of theses metals, facing organic light-emitting layers 221R, 221G, and 221B, and an auxiliary electrode or a bus electrode line including translucent materials such as ITO, IZO, ZnO, and $In_2O_3$. In the case of the reflective electrode, the second electrode 230 may include a layer including at least one of, for example, Li, Ca, LiF/Ca, LiF/Al, Al, and Mg. However, configurations and materials of the second electrode 230 are not limited thereto, and various modifications are possible.

Especially in the case of a top emission-type display apparatus, which emits light from organic light-emitting layers 221R, 221G, and 221B toward the second electrode 230, the second electrode 230 may be thin and be formed of transparent materials, such as indium tin oxide (ITO) and indium zinc oxide (IZO). However, transparent materials such as indium tin oxide (ITO) and indium zinc oxide (IZO) may not have sufficient electrical conductivity to be used for a large area electrode. Moreover, since a resistance of the second electrode 230 increases as the thickness decreases, a voltage drop may occur in the second electrode 230. Thus, to solve such a problem, an auxiliary electrode having a conductive material may be disposed on the second electrode 230, and a detailed description thereof will be described with reference to FIGS. 2 through 7.

The backplane may further include other various components. For example, as illustrated in FIG. 1, a thin film transistor (TFT) or a capacitor (Cap) may be disposed on the substrate 100. In addition, the backplane may include other components, such as a buffer layer 110 to prevent infiltration of impurities into a semiconductor layer of the TFT, a gate insulating layer 130 to insulate the semiconductor layer of the TFT from a gate electrode, an intermediate layer 150 to insulate a source electrode/a drain electrode of the TFT from the gate electrode, and the planarization layer 170, which covers the TFT and has a relatively flat top surface.

Figure 2:
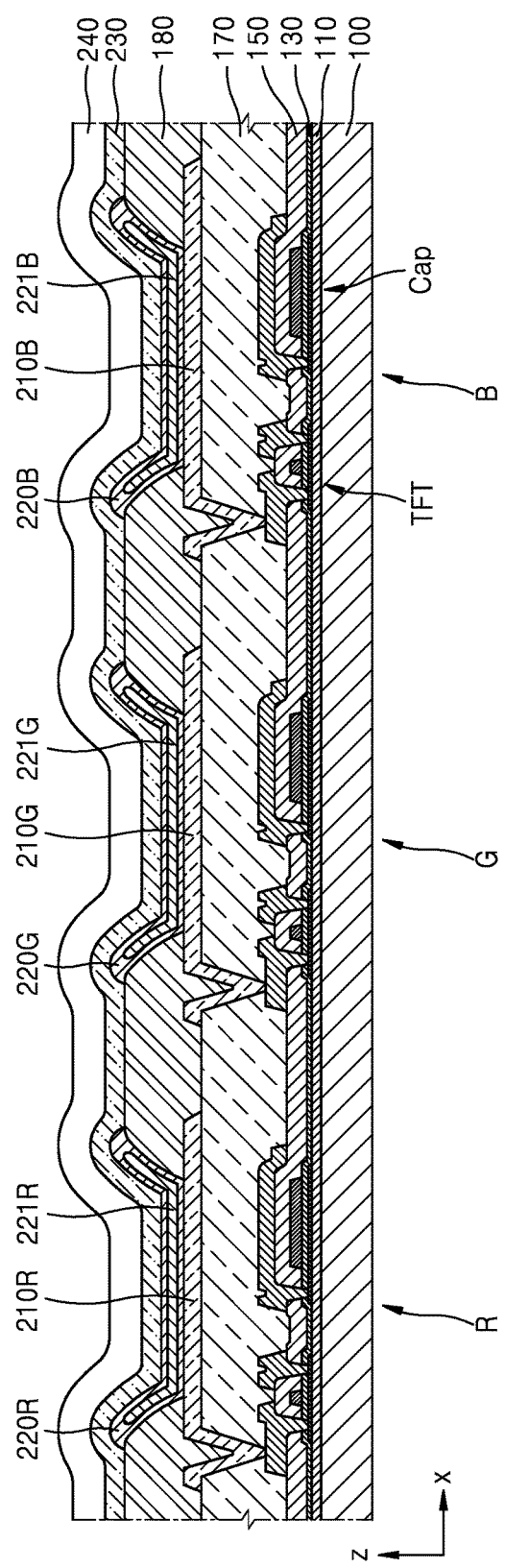

Referring to FIG. 2, a sacrificial layer 240 may be disposed on the second electrode 230. The sacrificial layer 240 may be disposed on the substrate 100 via methods such as doping, printing, and deposition. When the sacrificial layer 240 is disposed via a doping or printing method, patterning may be performed after hardening and polymerization depending on necessity.

The sacrificial layer 240 may include a highly fluorinated resin that contains fluoride at about 20 wt % to about 60 wt % or a fluorinated polymer. For example, the fluorinated polymer included in the sacrificial layer 240 may include at least one of a copolymer of polytetrafluoroethylene, polychlorotrifluoroethylene, polydichlorodifluoroethylene, chlorotrifluoroethylene, and dichlorodifluoroethylene, a copolymer of chlorotrifluoroethylene and perfluoroalkylvinylether, and a copolymer of tetrafluoroethylene and perfluoroalkylvinylether.

Such materials contain a considerable amount of fluorinated carbon, which does not physically/chemically react with materials of intermediate layers 220R, 220G, and 220B and the second electrode 230. Therefore, the materials in the sacrificial layer 240 may not damage intermediate layers 220R, 220G, and 220B, or may at least minimize damage thereto.

Figure 3:
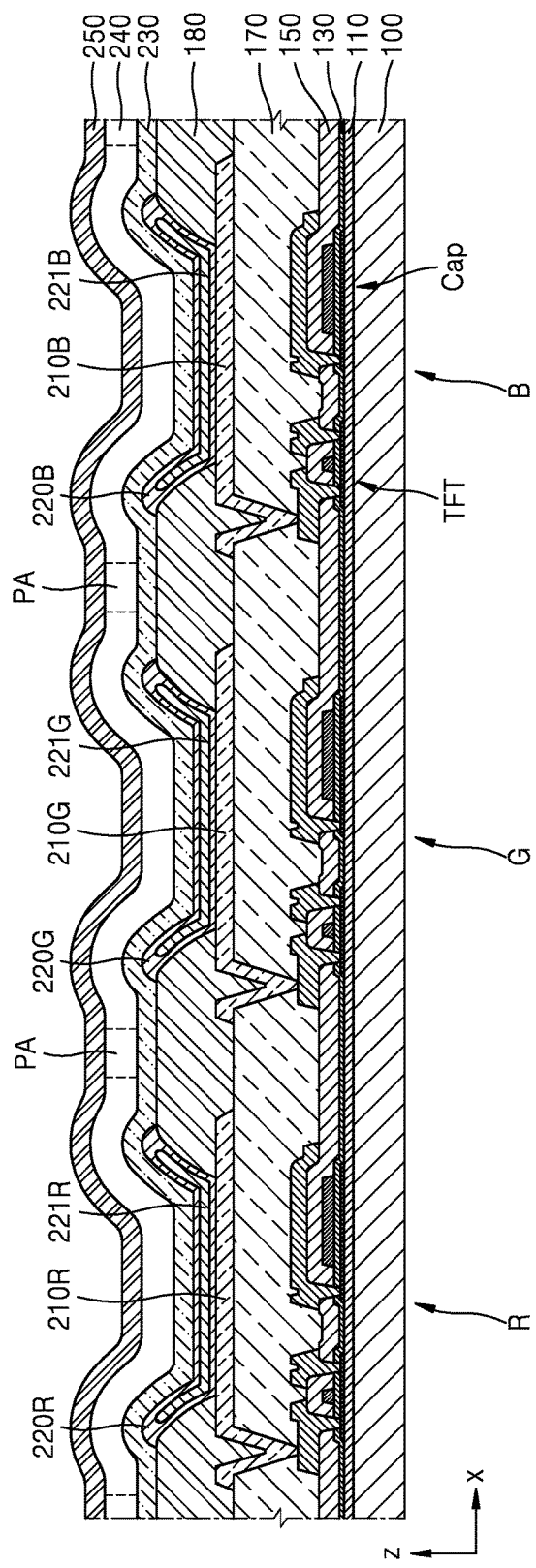
Figure 4:
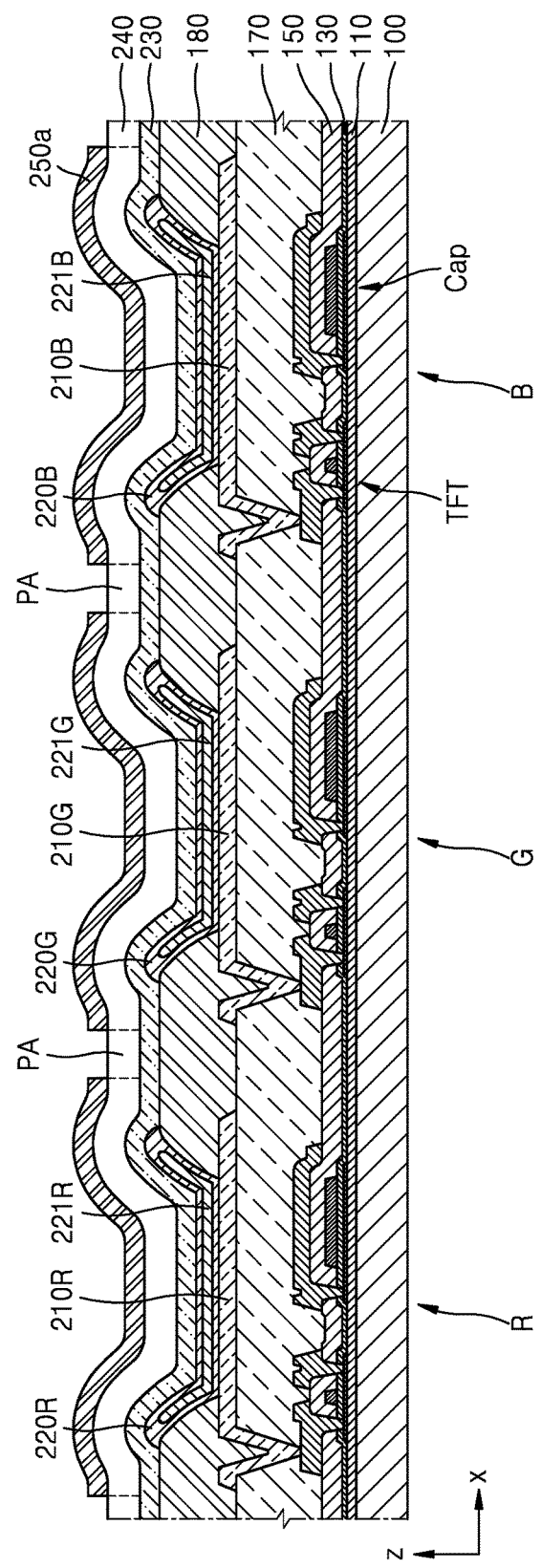

Referring to FIGS. 3 and 4, a photoresist layer 250 may be disposed on the sacrificial layer 240 and be patterned to expose a pre-arranged area PA of the sacrificial layer 240. In this case, the pre-arranged area PA of the sacrificial layer 240 may correspond to a portion of the sacrificial layer 240 to be removed to expose a portion of the second electrode 230.

The patterned photoresist layer 250a on the sacrificial layer 240 may be formed by partially exposing the photoresist layer 250 via a mask (not illustrated) and developing the exposed portion of the photoresist layer 250. When the photoresist layer 250 is a positive type, the exposed portion of the photoresist layer 250 may correspond to the pre-arranged area PA. When the photoresist layer 250 is a negative type, the exposed portion of the photoresist layer 250 may correspond to the remaining area except the pre-arranged area PA.

Figure 5:
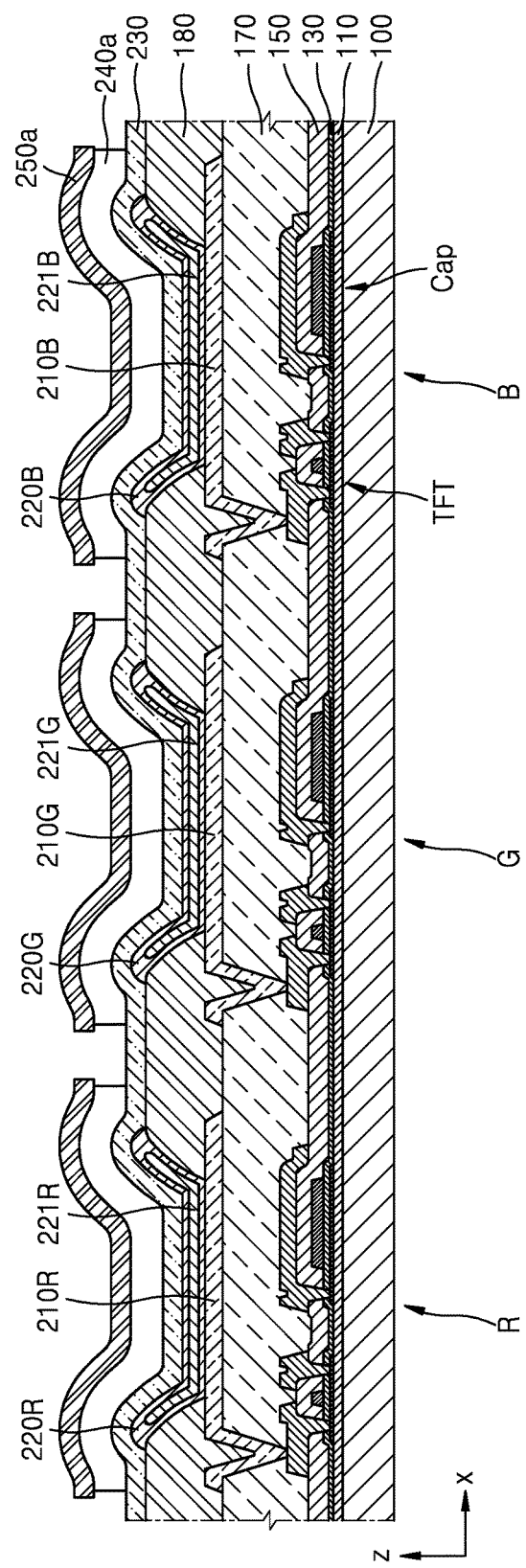

Referring to FIG. 5, a patterned sacrificial layer 240a may be formed by patterning the pre-arranged area PA of the sacrificial layer 240 illustrated in FIG. 4 via the patterned photoresist layer 250a. The patterned sacrificial layer 240a exposes a portion of the second electrode 230. In other words, the patterned photoresist layer 250a may be used as the mask for patterning the pre-arranged area PA of the sacrificial layer 240.

Various methods may be used as a patterning method of the sacrificial layer 240. For example, the sacrificial layer 240 may be etched using the patterned photoresist layer 250a. In the case of the etching process, the pre-arranged area PA of the exposed sacrificial layer 240 may be selectively dissolved, while the patterned photoresist layer 250a is not dissolved.

The patterned photoresist layer 250a need not be removed but may instead remain even after the patterning of the sacrificial layer 240.

Figure 6:
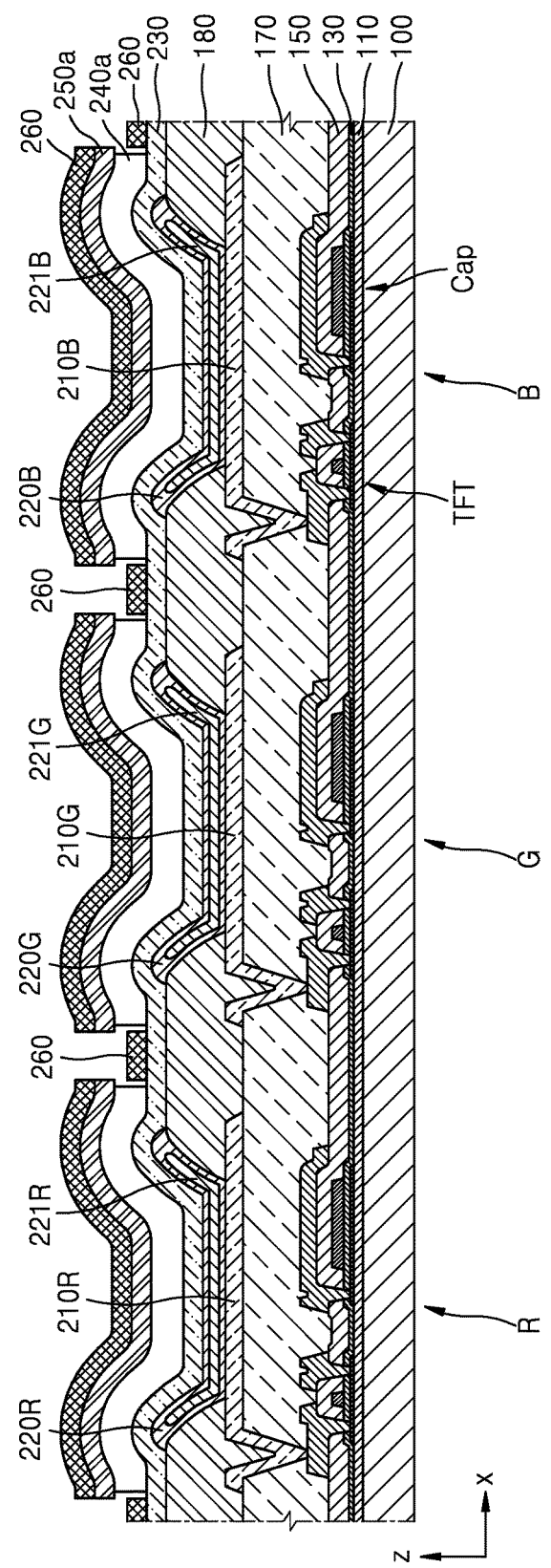

Referring to FIG. 6, a conductive layer 260 may be disposed on the patterned photoresist layer 250a and the exposed portion of the second electrode 230. The conductive layer 260 may correspond to an auxiliary electrode contacting the second electrode 230 and reduces the voltage drop in the second electrode 230.

The conductive layer 260 may include various materials. According to an exemplary embodiment, the conductive layer 260 may include metal materials with high conductivity. For example, the conductive layer 260 may include at least one of Al, Ag, Au, Cu, and Ni, and in this case, the conductive layer 260 may be disposed via a thermal deposition method.

According to another exemplary embodiment, the conductive layer 260 may include transparent conductive materials. For example, the conductive layer 260 may include at least one of ITO, IZO, ZnO, $In_2O_3$, IZO, and AZO, and in this case, the conductive layer 260 may be disposed via a sputtering method.

According to another exemplary embodiment, the conductive layer 260 may include light-absorbing materials. For example, the conductive layer 260 may include chromium (Cr), manganese (Mn), etc.

A portion of the conductive layer 260 contacting the second electrode 230 may be separated from the other portion of the conductive layer 260 disposed on the patterned photoresist layer 250a when the conductive layer 260 is disposed via a deposition method or the sputtering method, etc. For example, an additional height of the patterned sacrificial layer 240a may cause the portion of the conductive layer 260 contacting the second electrode 230 to be separated from the other portion of the conductive layer 260. A first portion of the conductive layer 260 may be disposed on the exposed portion of the second electrode 230, and a second portion of the conductive layer 260 may be disposed on the patterned sacrificial layer 240a and the patterned photoresist layer 250a.

Figure 7:
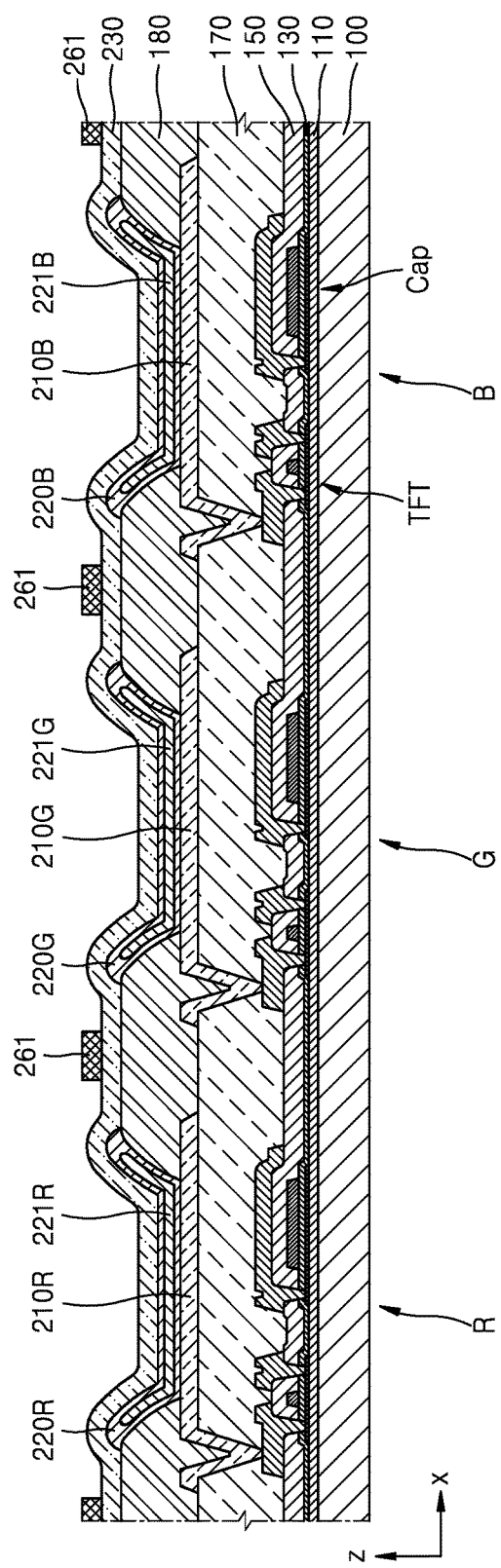

Referring to FIG. 7, the patterned sacrificial layer 240a and the patterned photoresist layer 250a may be removed such that only the portion, contacting the second electrode 230, of the conductive layer 260 remains. The remaining portion of the conductive layer 260 may be provided as an auxiliary electrode 261. A material used to remove the patterned sacrificial layer 240a may remove the patterned photoresist layer 250a and the patterned sacrificial layer 240a without damaging intermediate layers 220R, 220G, 220B, including organic light-emitting layers 221R, 221G, 221B. Materials for removing the patterned sacrificial layer 240a may include, for example, hydrofluoroethers (HFEs). Products sold under the brand name of Novec series by 3M, the United States, may include HFEs and be used in a method of manufacturing the organic light-emitting display apparatus according to an exemplary embodiment. For example, products available from the market under the brand name of Novec-7100, Novec-7200, Novec-7500, Novec-71IPA, Novec-72DE or Novec-72DaA by 3M, the United States, and/or a compound of these materials may be used. Novec-71IPA may have a composition of 95.5 wt % of Novec-7100 and 4.5 wt % of isopropanol (IPA), Novec-72De may have a composition of 10 wt % of Novec-7100, 20 wt % of Novec-7200 and 70 wt % of trans-1,2-dichloroethylene, and Novec-72Da may have a composition of 10 wt % of Novec-7100 and 20 wt % of Novec-7200, 68 wt % of trans-1,2-dichloroethylene and 2 wt % of IPA.

According to an exemplary embodiment, a portion of the conductive layer 260 corresponding to the auxiliary electrode 261 may be efficiently disposed on the second electrode 230 and the remaining portion of the conductive layer 260 may be removed efficiently by using the sacrificial layer 240. Furthermore, elements, for example intermediate layers 220R, 220G, and 220B, organic light-emitting layers 221R, 221G, and 221B, and the second electrode 230, may not be damaged and the second electrode 230 and the auxiliary electrode 261 may have a high definition when using the sacrificial layer 240.

FIG. 7 illustrates that the auxiliary electrodes are disposed between sub-pixels; however, exemplary embodiments are not limited thereto. The auxiliary electrode 261 may be disposed between certain sub-pixels among sub-pixels of the organic light-emitting display apparatus.

The auxiliary electrode 261 may reduce the voltage drop of the second electrode 230, especially when the second electrode 230 is relatively large. The auxiliary electrode 261 may include conductive materials. For example, the auxiliary electrode 261 may include identical materials with those of the second electrode 230 when the second electrode 230 is formed by transparent conductive materials such as ITO and IZO. In this case, a thickness of the second electrode 230, a transparent electrode, may partially increase and the voltage drop of the second electrode 230 may decrease.

The contrast ratio of the organic light-emitting display apparatus may decrease due to high reflection of the auxiliary electrode 261 having conductive materials. According to an exemplary embodiment, the auxiliary electrode 261 may include light-absorption materials, such as Cr and Mn. The light-absorption materials in the auxiliary electrode 261 may absorb light on a top portion of the auxiliary electrode 261 and a top portion of the second electrode 230, and a decrease in the contrast ratio of the organic light-emitting display apparatus may be prevented. According to an exemplary embodiment, a layer including a light-absorbing material may be disposed on the auxiliary electrode 261.

The auxiliary electrode 261 may have various shapes. For example, the auxiliary electrode 261 may have an island shape between respective sub-pixels, a stripe shape along a plurality of sub-pixels, or a mesh shape to surround each sub-pixel. Patterns of the auxiliary electrode 261 with various shapes may have a high resolution quality via the patterned sacrificial layer 240a described above. In addition, since such patterning of the auxiliary electrode 261 may be simultaneously performed for respective sub-pixels, much processing time in manufacturing a light-emitting display apparatus having a large size may be prevented.

FIGS. 1 through 7 illustrate that the second electrode 230 is disposed as one body throughout an entire surface of the substrate 100. However, the second electrode 230 may have separate shapes per respective sub-pixels. In this case, damage to not only the second electrode 230 but also intermediate layers 220R, 220G, and 220B including organic light-emitting layers 221R, 221G, and 221B and the pixel defining layer 180 below the second electrode 230 may be more effectively prevented via the patterned sacrificial layer 240a according to an exemplary embodiment.

Figure 8:
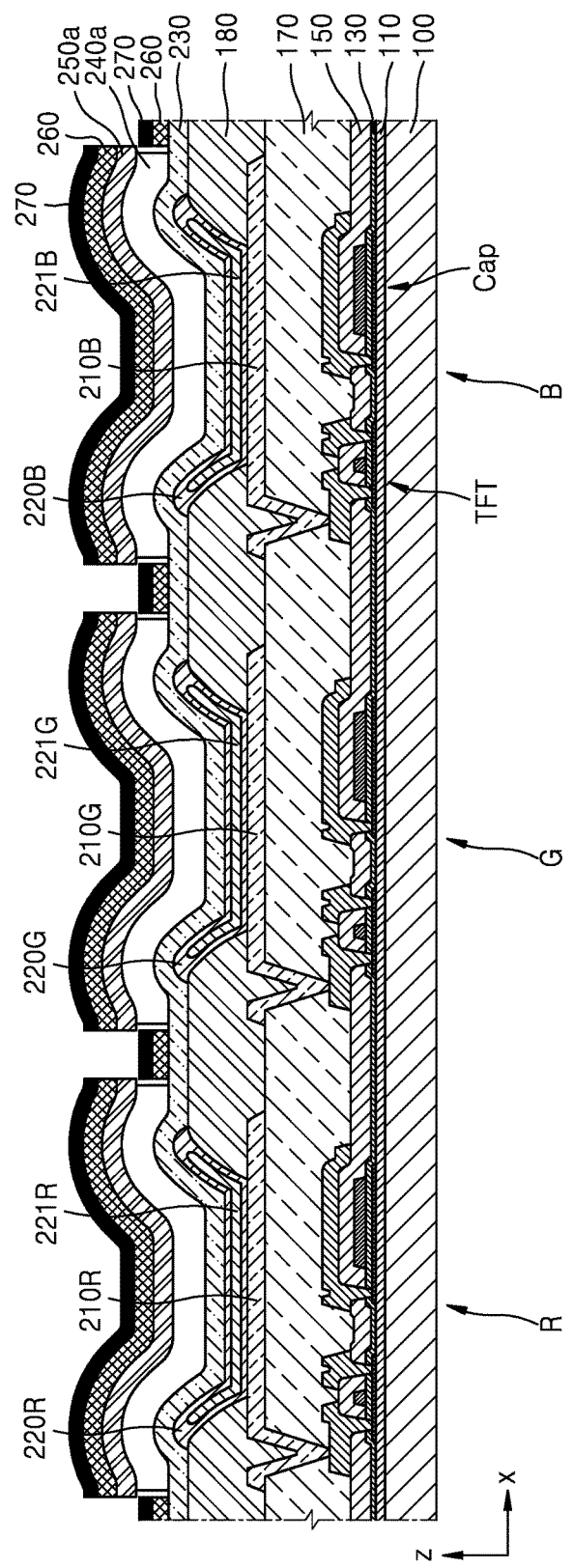
FIG. 8 and FIG. 9 are cross-sectional views illustrating manufacturing processes of the organic light-emitting display apparatus according to an exemplary embodiment.
Figure 9:
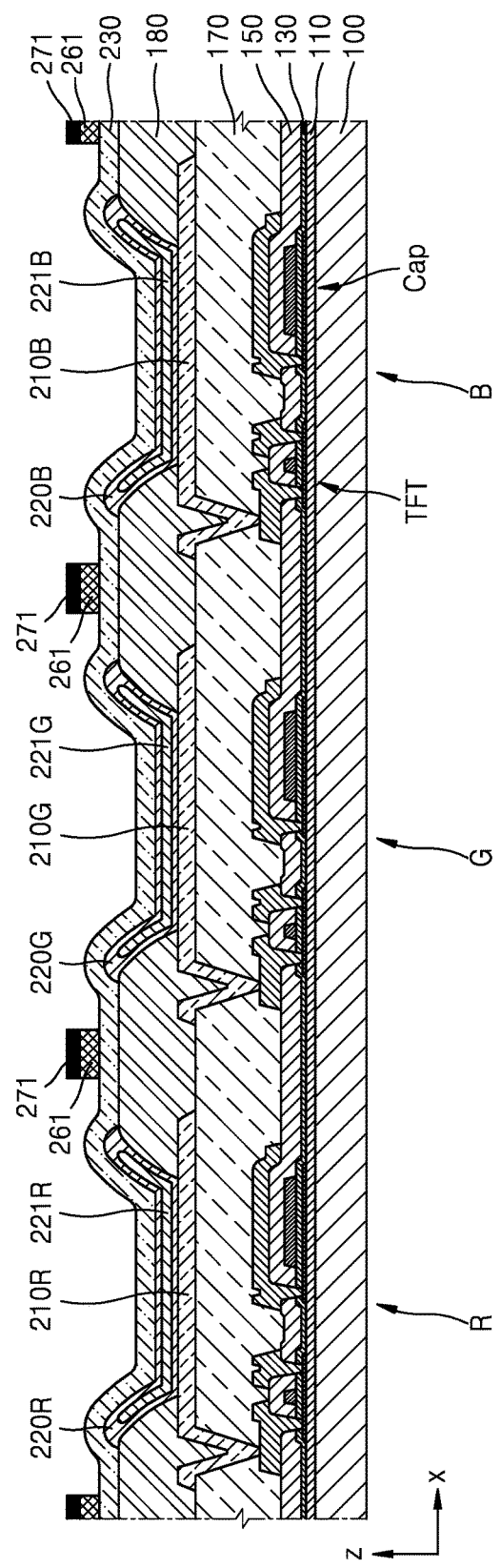

FIG. 8 and FIG. 9 are cross-sectional views illustrating manufacturing processes of the organic light-emitting display apparatus according to an exemplary embodiment.

First, according to the manufacturing processes illustrated in FIGS. 1 through 6, the patterned sacrificial layer 240a, the patterned photoresist layer 250a and the conductive layer 260 may be sequentially disposed.

Next, referring to FIG. 8, a light-absorbing material layer 270 may be disposed on the conductive layer 260. The light-absorbing material layer 270 may include a layer including a light-absorbing material, and the light-absorbing material may include metal materials such as Cr and Mn, or carbon black particles or graphite.

A portion of the light-absorbing material layer 270 may be disposed on a portion of the second electrode 230 that is not covered by the patterned sacrificial layer 240a and the patterned photoresist layer 250a, and another portion of the light-absorbing material layer 270 may be disposed on the patterned sacrificial layer 240a and the patterned photoresist layer 250a. In other words, a portion, of a laminated structure with the conductive layer 260 and the light-absorbing material layer 270, which contacts the second electrode 230, may be separated from the other portion of the laminated structure disposed on the patterned photoresist layer 250a.

Next, referring to FIG. 9, the patterned sacrificial layer 240a and the patterned photoresist layer 250a may be removed such that the portion, contacting the second electrode 230, of the laminated structure remains. The remaining light-absorbing material layer 271 may be further disposed on the auxiliary electrode 261. The light-absorption material in the light-absorbing material layer 270 may absorb light on a top portion of the auxiliary electrode 261 and a top portion of the second electrode 230. Even though the auxiliary electrode 270 includes conductive materials, a decrease in the contrast ratio of the organic light-emitting display apparatus may be prevented.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A method of manufacturing an organic light-emitting display apparatus, the method comprising:
   forming a first electrode on a substrate;
   forming a pixel defining layer on the substrate, the pixel defining layer including an opening exposing a portion of the first electrode and corresponding to a pixel;

forming a second electrode on the pixel defining layer and the portion of the first electrode;

forming a sacrificial layer on the second electrode;

patterning the sacrificial layer so as to expose a portion of the second electrode, wherein the portion of the second electrode is disposed on the pixel defining layer;

forming a conductive layer on the sacrificial layer and the portion of the second electrode; and removing the sacrificial layer such that a portion of the conductive layer on the portion of the second electrode remains.

2. The method of claim 1, further comprising:

forming a photoresist layer on the sacrificial layer; and patterning the photoresist layer so as to expose a portion of the sacrificial layer, wherein:

the portion of the sacrificial layer is disposed on the portion of the second electrode; and the sacrificial layer is patterned by using the patterned photoresist layer.

3. The method of claim 2, further comprising removing the patterned photoresist layer when the sacrificial layer is removed.

4. The method of claim 1, wherein the sacrificial layer comprises highly fluorinated resin or fluorinated polymer that contains fluoride of about 20 wt % to about 60 wt %.

5. The method of claim 1, wherein the removing of the sacrificial layer is executed by using hydrofluoroethers (HFEs).

6. The method of claim 1, wherein the conductive layer comprises at least one of aluminum (Al), silver (Ag), gold (Au), copper (Cu), and nickel (Ni).

7. The method of claim 1, wherein the conductive layer comprises a same material as a material of the second electrode.

8. The method of claim 1, wherein the conductive layer comprises at least one of indium tin oxide (ITO), indium zinc oxide (IZO), ZnO, In2O3, indium gallium oxide (IGO), and aluminum zinc oxide (AZO).

9. The method of claim 1, wherein the conductive layer comprises a light-absorbing material.

10. The method of claim 1, further comprising forming a light-absorbing material layer on the conductive layer, wherein the removing of the sacrificial layer comprises leaving a portion of the light-absorbing layer being disposed on the portion of the conductive layer.

11. The method of claim 1, further comprising forming an organic light-emitting layer between the first electrode and the second electrode.

12. The method of claim 11, wherein light from the organic light-emitting layer is emitted towards the second electrode.

13. The method of claim 1, wherein the portion of the conductive layer exposed by the pixel defining layer contacts the second electrode.

14. The method of claim 1, wherein the forming of the pixel defining layer comprises forming the pixel defining layer to cover another portion of the first electrode, the pixel defining layer including an opening exposing the portion of the first electrode.

* * * * *